United States Patent
Pheng et al.

(10) Patent No.: US 6,899,857 B2
(45) Date of Patent: May 31, 2005

(54) METHOD FOR FORMING A REGION OF LOW DIELECTRIC CONSTANT NANOPOROUS MATERIAL USING A MICROEMULSION TECHNIQUE

(75) Inventors: Soo Choi Pheng, Loher (MY); Lap Chan, San Francisco, CA (US); Wang Cui Yang, Singapore (SG); Siew Yong Kong, Berjaya (MY); Alex See, Singapore (SG)

(73) Assignee: Chartered Semiconductors Manufactured Limited, Singapore (SG)

( * ) Notice: Subject to any disclaimer, the term of this patent is extended or adjusted under 35 U.S.C. 154(b) by 0 days.

(21) Appl. No.: 10/012,298

(22) Filed: Nov. 13, 2001

(65) Prior Publication Data

US 2003/0092251 A1 May 15, 2003

(51) Int. Cl.[7] .......................... C01B 33/12; C03C 3/00; C04B 38/00; C04B 35/14
(52) U.S. Cl. .......................... 423/338; 501/12; 501/80; 501/133; 438/778; 257/E21.271; 257/E21.273
(58) Field of Search .......................... 501/12, 80, 133; 423/338; 438/600

(56) References Cited

U.S. PATENT DOCUMENTS

| | | | | |
|---|---|---|---|---|
| 5,019,419 A | * | 5/1991 | Matsumoto et al. | |
| 5,840,813 A | * | 11/1998 | Gornowicz et al. | |
| 5,955,140 A | * | 9/1999 | Smith et al. | 427/96 |
| 6,037,277 A | * | 3/2000 | Masakara et al. | 438/787 |
| 6,097,095 A | * | 8/2000 | Chung | 257/774 |
| 6,146,986 A | * | 11/2000 | Wagganer | 438/618 |
| 6,156,651 A | * | 12/2000 | Havemann | 438/674 |
| 6,156,812 A | * | 12/2000 | Lau et al. | 521/77 |
| 6,159,295 A | * | 12/2000 | Maskara et al. | 118/688 |
| 6,172,128 B1 | * | 1/2001 | Lau et al. | 521/77 |
| 6,187,248 B1 | * | 2/2001 | O'Neill et al. | 264/425 |
| 6,208,014 B1 | * | 3/2001 | Wu et al. | 257/629 |
| 6,214,746 B1 | * | 4/2001 | Leung et al. | 438/700 |
| 6,228,340 B1 | * | 5/2001 | Imhof et al. | 423/338 |
| 6,287,955 B1 | * | 9/2001 | Wang et al. | 438/623 |

FOREIGN PATENT DOCUMENTS

DE     2731869    * 9/1978

* cited by examiner

*Primary Examiner*—Long Pham
*Assistant Examiner*—Shrinivas Rao

(57) ABSTRACT

A method for forming a region of low dielectric constant nanoporous material is disclosed. In one embodiment, the present method includes the step of preparing a microemulsion. The method of the present embodiment then recites applying the microemulsion to a surface above which it is desired to form a region of low dielectric constant nanoporous material. Next, the present method recites subjecting the microemulsion, which has been applied to the surface, to a thermal process such that the region of low dielectric constant nanoporous material is formed above the surface.

17 Claims, 5 Drawing Sheets

METHOD FOR FORMING A REGION OF LOW DIELECTRIC CONSTANT NANOPOROUS MATERIAL USING A MICROEMULSION TECHNIQUE

FIELD OF THE INVENTION

The present claimed invention relates to the field of semiconductor processing. More particularly, the present claimed invention relates to a method for forming a nanoporous material suited for use as an intermetal dielectric (IMD) and/or interlayer dielectric (ILD) material.

BACKGROUND ART

As semiconductor geometries continue to become smaller and smaller, new difficulties arise in the fabrication of semiconductor devices. As one example, with progressively finer design rules, a problem has arisen due to capacitance between adjacent metal layers (i.e. interlayer capacitance). That is, as devices shrink in size, adjacent layers are spaced more closely together. Such a condition results in a deleterious increase in interlayer capacitance which adversely affects operation of finer design rule-based semiconductor devices. A similar problem exists due to the reduced distance between adjacent metal lines. Specifically, under some circumstances, unwanted effects such as cross-talk and various other RC (resistance/capacitance) effects between closely spaced metal lines negatively affect the operation of the semiconductor devices.

It is well known that the dielectric constant for a conventional interlayer dielectric material such as, for example, CVD-deposited silicon dioxide is around 3.9. However, according to the SIA (Semiconductor Industry Association) roadmap, by the year 2005 ultra-low dielectric constant materials (i.e. materials with a dielectric constant of 2.0 or less) will be required for use in 100 nanometer generation integrated circuits. Therefore, it is increasingly important to reduce the dielectric constant of an interlayer and/or intermetal insulating material.

It is generally agreed that only porous materials can achieve the desired reduced dielectric constants (i.e. dielectric constant of less than 2.0). One conventional method for creating a porous dielectric material is to positively form voids within the material. In one prior art approach, small particles within the dielectric are subjected to an etching process. However, such a prior art approach is not particularly cost effective, is not time effective, and does not readily produce desired results.

Furthermore, in order to achieve widespread acceptance, and to ensure affordability, any method of forming a low dielectric constant nanoporous material, which overcomes the above-listed drawbacks, should be compatible with existing semiconductor fabrication processes.

Thus, a need exists for a method for forming a nanoporous material for reducing interlayer capacitance and reducing RC effects between neighboring metal lines. Yet another need exists for a method for forming a nanoporous material which meets the above need and which does not require etching of small particles. Still another need exists for a method for forming a nanoporous material wherein the method meets all of the above-listed needs and wherein the method is compatible with existing semiconductor fabrication processes.

SUMMARY OF INVENTION

The present invention provides a method for forming a nanoporous material for reducing interlayer capacitance and reducing RC effects between neighboring metal lines. The present invention further provides a method for forming a nanoporous material which achieves the above accomplishment and which does not require etching of small particles. The present invention further provides a method for forming a nanoporous material wherein the method achieves the above-listed accomplishments and wherein the method is compatible with existing semiconductor fabrication processes.

In one embodiment of the present invention, the present method includes the step of preparing a microemulsion. The method of the present embodiment then recites applying the microemulsion to a surface above which it is desired to form a region of low dielectric constant nanoporous material. Next, the present method recites subjecting the microemulsion, which has been applied to the surface, to a thermal process such that the region of low dielectric constant nanoporous material is formed above the surface.

In another embodiment, the present invention includes the steps of the above-described embodiment, and further includes the step of subjecting the microemulsion, after application to the surface, to a thermal process. In this embodiment, the thermal process includes a first thermal treatment stage and a second thermal treatment stage. In the present embodiment, the first thermal treatment stage is performed to remove water and surfactant such that pores are formed. Furthermore, the second thermal treatment stage is performed to induce hardness and promote adhesion of the microemulsion to the surface above which it is desired to form a region of low dielectric constant nanoporous material.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

The accompanying drawings, which are incorporated in and form a part of this specification, illustrates embodiments of the invention and, together with the description, serve to explain the principles of the invention.

The drawings referred to in this description should be understood as not being drawn to scale except if specifically noted.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Figure 1A:
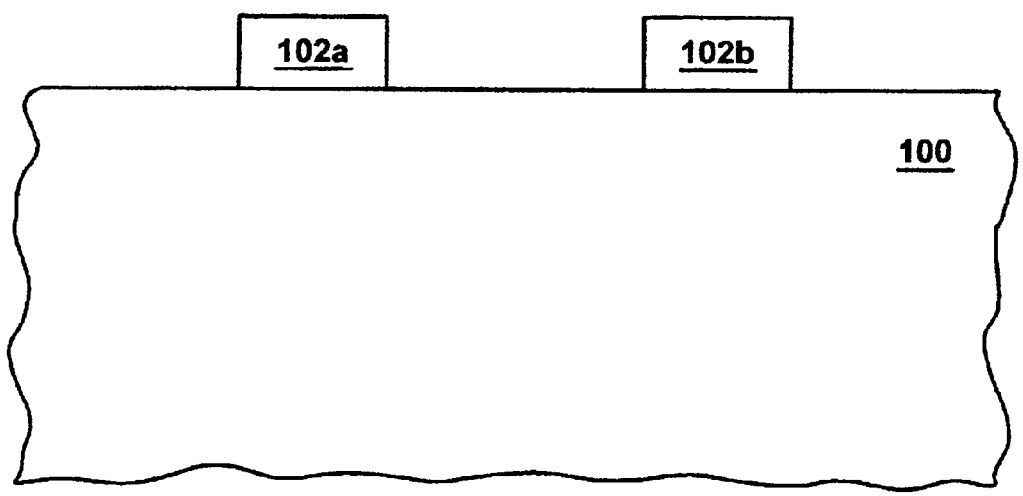
FIG. 1A is a side sectional view of the structure above which a region of nanoporous dielectric material will be formed in accordance with one embodiment of the present claimed invention.
Figure 1B:
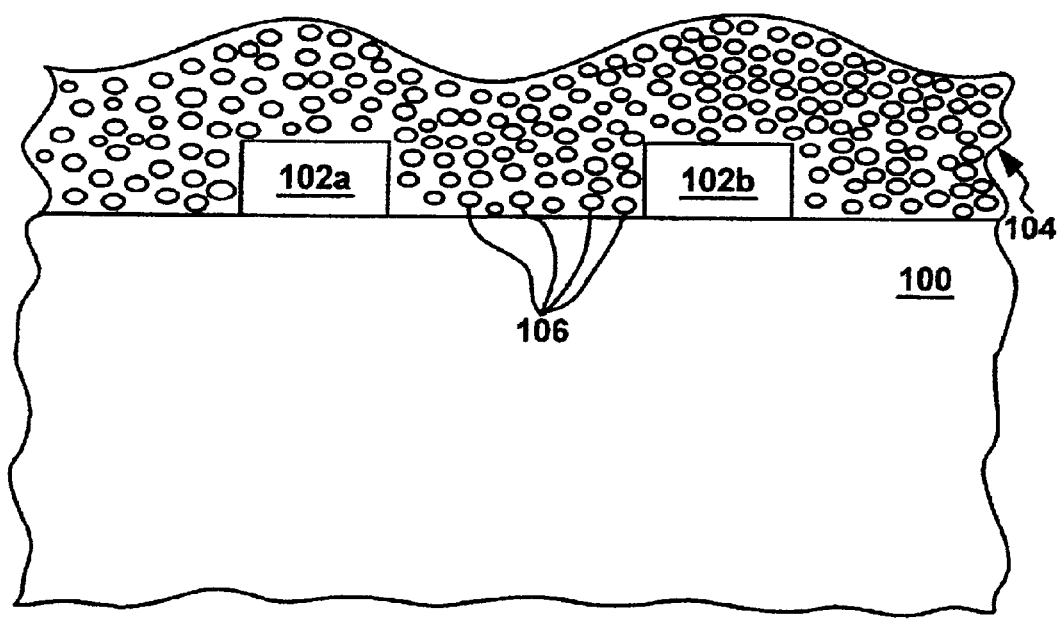
FIG. 1B is a side sectional view of the structure of FIG. 1A having an emulsion deposited thereabove in accordance with one embodiment of the present claimed invention.
Figure 1C:
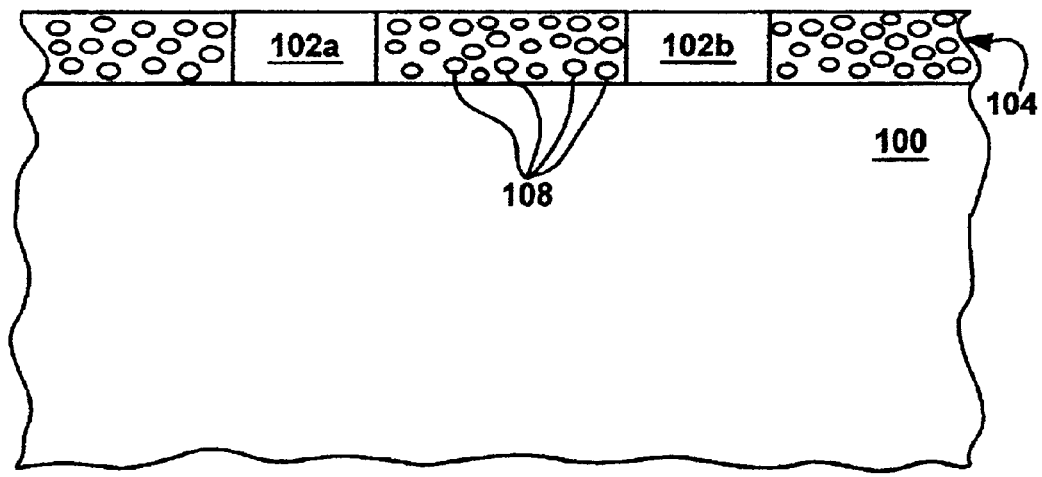
FIG. 1C is a side sectional view of the structure of FIG. 1B after the emulsion has been subjected to a thermal process and after a planarizing process has been performed in accordance with one embodiment of the present claimed invention.
Figure 2:
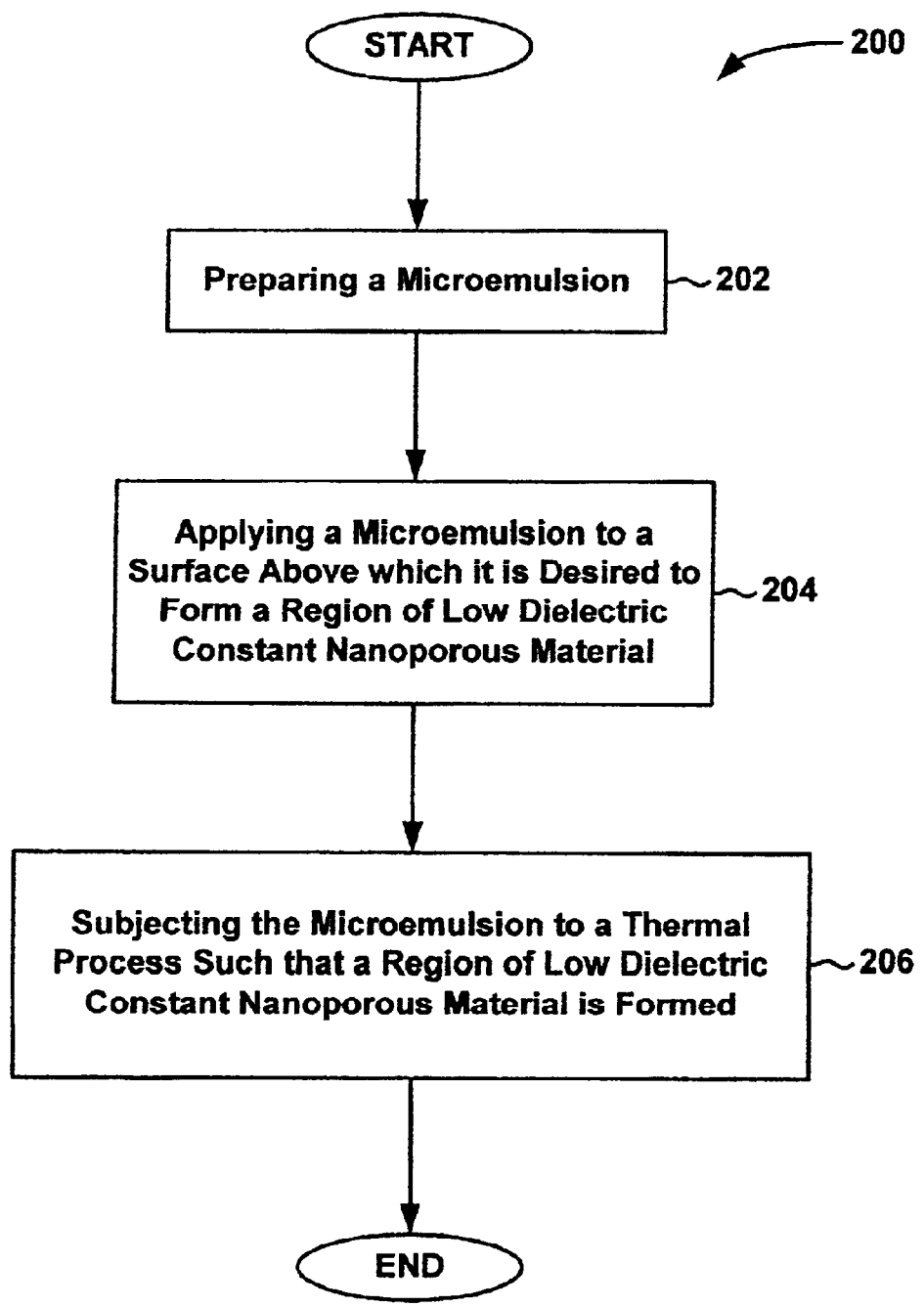
FIG. 2 is a flow chart of steps performed in accordance with one embodiment of the present claimed invention.
Figure 3:
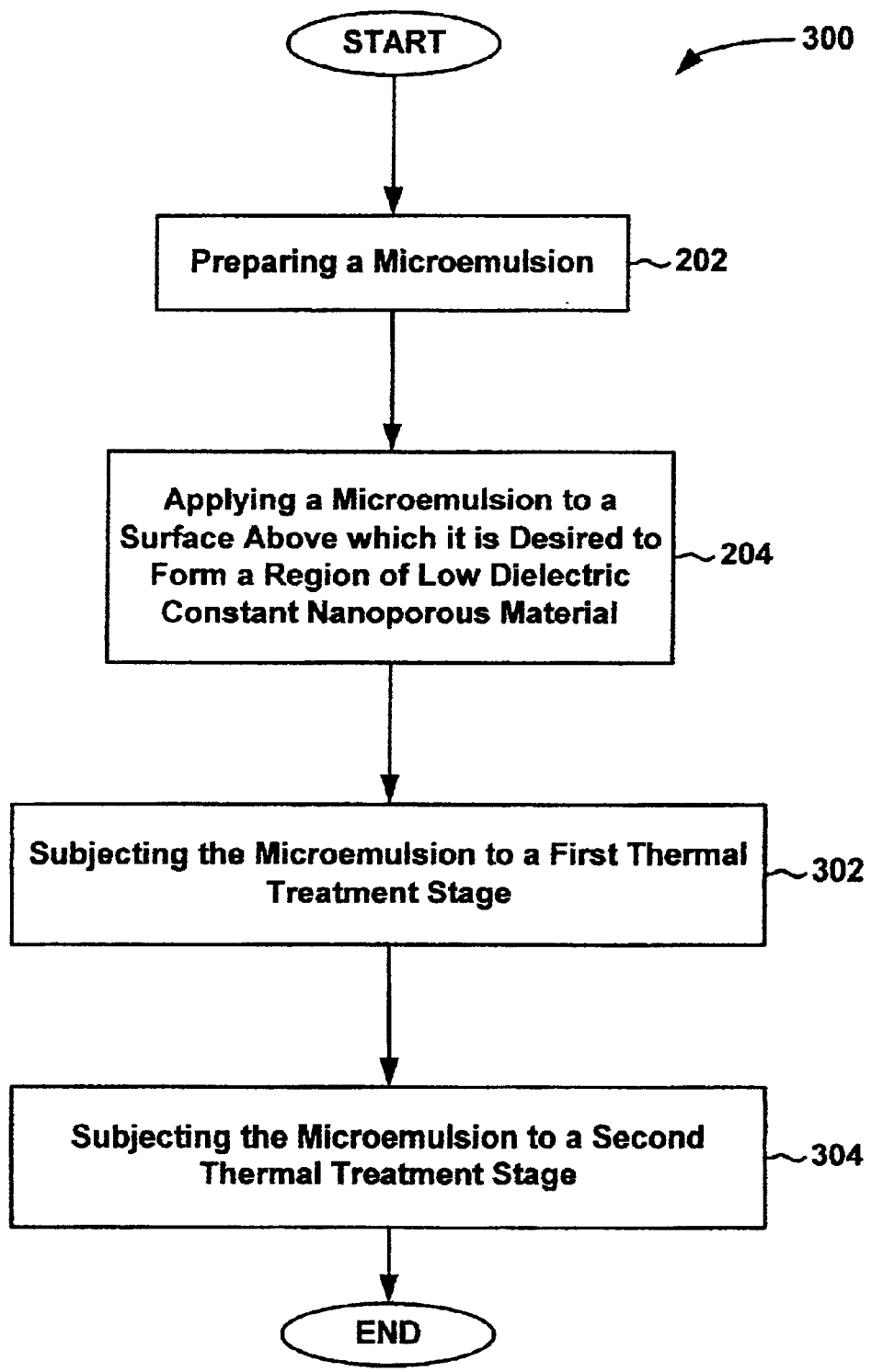
FIG. 3 is a flow chart of steps performed in accordance with another embodiment of the present claimed invention.

FIGS. 1A–1C provide side sectional views of an exemplary structure created according to embodiments of the method of the present invention as set forth in the flow charts of FIGS. 2 and 3. For purposes of clarity, the following discussion will utilize the side sectional views of FIGS. 1A–1C in conjunction with the flow chart of FIGS. 2 and 3 to clearly describe the embodiments of the present invention. FIG. 1A shows a surface 100 above which it is desired to form a region of low dielectric constant nanoporous material. Surface 100 is, for example, a first patterned metal layer containing metal lines 102a and 102b which will benefit from having a low dielectric constant nanoporous material disposed therebetween. Surface 100 is also well suited to being, for example, a first, second or higher, patterned metal layer which will subsequently have another metal layer formed thereabove. In such an instance, the low dielectric constant nanoporous material of the present invention will function superbly as an intermetal dielectric (IMD) material. Surface 100 is also well suited to being, for example, a semiconductor substrate into which active devices have been formed (i.e. prior to the deposition and patterning of the first metal layer). In such an instance, the low dielectric constant nanoporous material of the present invention will function superbly as an interlayer dielectric (ILD) material.

Referring now to flow chart 200 of FIG. 2, the present embodiment begins with step 202. At step 202, the method of the present embodiment comprises preparing a microemulsion. In one embodiment, this emulsion which eventually comprises the low-k material of the present embodiment is a class of poly (di-organo-siloxane) material which is deposited (e.g. spin-coated) from a microemulsion. In the present embodiment, the organo groups can be methyl, ethyl, propyl, vinyl, allyl, or phenyl.

With reference still to step 202, in the present embodiment, microemulsion comprises particle sizes of nanometer-level with the biggest particle less than approximately 0.15 microns. For purposes of the present Application, the pores remaining due to the presence of the particles are referred to as nanopores. In this embodiment, the polymerization occurs in each of the nano or micro-size particles or micelles. Each of these micelles is stabilized by a surfactant. More specifically, a discussion follows covering the formation of one embodiment of the microemulsion of the present invention. The polymerization reaction employed in the present embodiment uses cyclic siloxanes as the precursor. It is then polymerized using emulsion polymerization techniques. More specifically, oligomers react with other oligomers through condensation reactions to form poly (diorgano-siloxane). Additionally, in this embodiment, surfactants are used to stabilize the polydiorganosiloxane in the form of small sized droplets (e.g. in the organic phase) suspended within the water phase. As will be described below in detail, when the water is removed during subsequent thermal processing, a porous (e.g. nanoporous) structure is left behind.

Referring still to step 202 of FIG. 2, the polymerization medium used in the present embodiment comprises: water; an effective amount of surfactant to stabilize the polydiorganosiloxane droplets formed; and an effective amount of catalyst to polymerize the polydiorganosiloxane precursor. Furthermore, the catalyst can also function as a surfactant (e.g. dodecylbenzenesulfonic acid). As an additional benefit, substantially all known condensation polymerization catalysts used in the emulsion polymerization of cyclopolysiloxanes are useful in performing step 202 of the present invention. Such catalysts include cationic and anionic species. The former includes strong bases (e.g. quaternary ammonium hydroxides of the formula $R_4NOH$ and metal hydroxides (NaOH). Moreover, anionic catalysts include strong mineral acids, aliphatically substituted benzenesulfonic acids, and aliphatic sulfonic acids, but are not limited to such catalysts. Any catalysts that polymerize cyclopolysiloxanes in the presence of water are useful in performing step 202 of the present invention.

Referring still to step 202 of the present invention, a wide range of types of surfactants can be used to practice step 202 of FIG. 2. Anionic, nonionic and cationic surfactants are useful in stabilizing the emulsion of the cyclic siloxane precursor and the polydiorganosiloxane microemulsion formed. Anionic surfactants which are useful include the sulfonic acids and their salts (described in Findley, U.S. Pat. No. 3,294,725) particularly, dodecylbenzenesulfonic acid and its salts. In one embodiment of the present invention, the microemulsion formed at step 202 of FIG. 2 is an aqueous microemulsion which is at equilibrium looks clear, and contains about 10–35 weight percent of the polymer. However, lower polymer content emulsion can be prepared if less viscous emulsion is desirable to form a thin film.

With reference still to step 202 of FIG. 2, in order to form stable aqueous microemulsions, it is important to keep the concentration of the unreacted siloxanes precursor droplets low, and to provide a means by which the unreacted droplets can be reacted, solubilized, and dispersed into the aqueous (or water) phase. In this embodiment, these two goals are accomplished by slowly adding a precursor emulsion to a heated polymerization medium. The siloxane precursor droplets provide high surface area to volume ratio. This high ratio provides more polymerization initiation sites, and increases the area available for solubilization and dispersion of the reactive molecules.

Furthermore, at step 202 of the present embodiment, the temperature of the polymerization medium, the rate of polymerization, and the rate of addition of the precursor emulsion to the polymerization medium are interrelated to produce clear microemulsions. Higher rates of polymerization allow for faster rates of addition of the precursor emulsion. Elevating the temperature of the polymerization medium increases the rate of polymerization and allows the precursors to be added to the polymerization medium more quickly. Low temperatures require slower rates of addition. Additionally, in one embodiment of the present invention, the precursor emulsion should be added to the polymerization medium in a continuous fashion over a period of time. However, the addition can be accomplished by adding a series of small portions of the precursor emulsion to the polymerization medium as long as the serial additions maintain a low concentration of the siloxane precursor droplets. The rate of addition can vary during the addition step. In general, the slower the rate of addition of the precursor emulsion to the polymerization medium is, the smaller the resulting droplet size is. The maximum effective rate of addition for a given precursor, surfactant and catalyst combination will be unique. Optimization of the addition rate can be done by visually monitoring the appearance of the microemulsion formed.

Referring still to step 202 of FIG. 2, the ratio of the combination of the ingredients is also critical. For instance, the addition of 150 grams of precursor emulsion, comprised of 40 percent precursor, to 150 grams of polymerization medium over about two hours at more than 50 degrees Celsius produced a clear, stable microemulsion with an average droplet size of less than approximately 0.10 micron. Also, the degree of polymerization of the polydiorganosiloxane in the microemulsion can be controlled by neutralizing the catalyst when the desired amount of polymerization has been achieved. This has effect on the resulted viscosity. Although such specific implementation details are provided for the preparing of an emulsion, the present invention is not limited to such specific details. More importantly, the present invention, as will be further described below in detail, uses an emulsion to ultimately produce a low dielectric constant nanoporous material.

With reference now to step 204, the present method recites applying the microemulsion prepared at step 202 above the surface of FIG. 1A. That is, at step 204, the present embodiment applies the emulsion prepared at step 202 to a surface above which it is desired to form a region of low dielectric constant nanoporous material. FIG. 1B shows a side sectional view of the structure of FIG. 1A after the emulsion 104 prepared in accordance with step 202 of FIG. 2 has been applied thereabove. In one embodiment, emulsion 104 prepared at step 204, is applied above the surface of substrate 100 so as to provide a low dielectric constant nanoporous material between metal lines 102a and 102b of, for example, a first patterned metal layer disposed, for example, on the top surface of substrate 100. Hence, in the present embodiment, a method is provided for forming a nanoporous material, after subsequent treatment, which reduces RC effects between neighboring metal lines. Thus, in such an embodiment, the low dielectric constant nanoporous material of the present invention functions superbly as an interlayer dielectric (ILD) material.

Referring still to FIG. 1B and to step 204 of FIG. 2, in another embodiment, emulsion 104 prepared at step 204, is applied above the surface of substrate 100 so as to provide a low dielectric constant nanoporous material between adjacent metal layers (not shown) sequentially formed above the top surface of substrate 100. Hence, in such an embodiment, a method is provided for forming a nanoporous material, after subsequent treatment, which reduces interlayer capacitance. That is, the low dielectric constant nanoporous material of the present invention functions superbly as an intermetal dielectric (IMD) material. Although such specific implementations of the present method are recited above, the present invention is well suited to employing the present method to form a region of low dielectric constant nanoporous material for various other applications and purposes.

Referring again to FIG. 1B, the emulsion contains water and surfactant areas typically shown as areas 106, in FIG. 1B. Areas 106 typically have a nanometer-level size (e.g. the biggest particle is less than 0.15 microns in diameter). As will be described below in conjunction with the discussion of FIG. 1C and step 206 of FIG. 2, the water and surfactants present in areas 106 are eventually removed/decomposed by a thermal process to leave pores in emulsion 104.

With reference still to FIG. 1B, and to step 204, in one embodiment of the present invention, step 204 comprises applying emulsion 104 to the surface above which it is desired to form the region of low dielectric constant nanoporous material using a spin-on-process. In one such embodiment, emulsion 104 is applied with a uniform thickness above the surface of substrate 100 using such a spin-on-process. Furthermore, in still another embodiment, emulsion 104 is applied with a uniform thickness of approximately one micron above the surface of substrate 100 using such a spin-on-process. In yet another embodiment, step 204 comprises applying emulsion 104 to the surface above which it is desired to form the region of low dielectric constant nanoporous material using a spin-on-process which employs a spin speed of approximately 1000 to 4000 revolutions per minute. Although such specific emulsion application implementations of the present method are recited above, the present invention is well suited to applying emulsion 104 using various other application processes.

With reference now to FIG. 1C, and to step 206 of FIG. 2, the present embodiment then subjects emulsion 104 which has been applied to the surface of substrate 100, to a thermal process. In so doing, emulsion 104 is formed into a region of low dielectric constant nanoporous material above the surface of substrate 100. The thermal process of step 206: drives out water and surfactants present in emulsion 104 such that pores 108 are formed; hardens emulsion 104; and improve adhesion of emulsion 104 to the surface above which it is desired to form the region of low dielectric constant nanoporous material. More specifically, in the present embodiment, the thermal process of step 206 removes water and surfactant from areas 104 of FIG. 1B such that pores 108 are formed as shown in FIG. 1C. During the thermal process, the water and surfactant diffuse out of the film which comprises the rest of the region of low dielectric constant nanoporous material (now shown as 104). As a result, a cured region of low dielectric constant nanoporous material 104 is formed above substrate 100.

Referring still to FIG. 1C, in one embodiment of the present invention, a planarizing step (e.g. chemical mechanical polishing (CMP)) is then performed to provide a smooth upper surface on region of low dielectric constant nanoporous material 104.

With reference still to FIG. 1C and to step 206 of FIG. 2, the method of the present embodiment advantageously forms a nanoporous material without requiring the tedious etching of small particles associated with conventional processes. Additionally, the method of the present embodiment achieves its accomplishments without requiring substantial revamping/retooling of existing semiconductor fabrication processes and equipment.

With reference now to FIG. 3, a flow chart 300 of steps performed in accordance with another embodiment of the present invention is shown. As shown in flow chart 300, the method of the present embodiment includes the steps and features of the above-described embodiment (i.e. as recited in steps 202–206, and shown in FIGS. 1A–1C) with the exception that the thermal process of step 206 is replaced by steps 302 and 304. For purposes of brevity and clarity, a discussion of steps 202 and 204 is not repeated here. Steps 302 and 304 are described below in detail.

At step 302, the thermal process of this embodiment performs a first thermal treatment stage to remove water and surfactants from emulsion 104 such that pores 108 are formed. In one embodiment, the first thermal treatment stage comprises subjecting emulsion 104, which has been applied to the surface of substrate 100, to a temperature of approximately 200 degrees Celsius.

At step 304, the thermal process of this embodiment then performs a second thermal treatment stage to harden emulsion 104 and improve adhesion of emulsion 104 to, for example, the surface of substrate 100. In one embodiment, the second thermal treatment stage comprises subjecting emulsion 104, which has been applied to the surface of substrate 100, to a temperature of approximately 350 degrees Celsius.

With reference still to FIG. 1C and to steps 302 and 304 of FIG. 3, the method of the present embodiment advantageously forms a nanoporous material without requiring the tedious etching of small particles associated with conventional processes. Additionally, the method of the present embodiment achieves its accomplishments without requiring substantial revamping/retooling of existing semiconductor fabrication processes and equipment.

Although such specific thermal process steps of the present method are recited above, the present invention is well suited to subjecting emulsion 104 to various other thermal process temperatures, exposure times, and conditions.

Thus, the present invention provides a method for forming a nanoporous material for reducing interlayer capacitance and reducing RC effects between neighboring metal lines. The present invention further provides a method for forming a nanoporous material which achieves the above accomplishment and which does not require etching of small particles. The present invention further provides a method for forming a nanoporous material wherein the method achieves the above-listed accomplishments and wherein the method is compatible with existing semiconductor fabrication processes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications are suited to the particular use contemplated. It is intended that the scope of the invention be defined by the claims appended hereto and their equivalents.

What is claimed is:

1. A method for forming a region of low dielectric constant nanoporous material, said method comprising the steps of:
   a) preparing a microemulsion that is stable, wherein said microemulsion includes polydiorganosiloxane material, and wherein said step a) includes
      using an emulsion polymerization technique to form said polydiorganosiloxane material by using a polymerization catalyst to catalyze polymerization of a polydiorganosiloxane precursor comprising a cyclic siloxane;
   b) applying said microemulsion to a surface above which it is desired to form said region of low dielectric constant nanoporous material; and
   c) subjecting said microemulsion, which has been applied to said surface, to a thermal process such that said region of low dielectric constant nanoporous material is formed above said surface.

2. The method for forming a region of low dielectric constant nanoporous material as recited in claim 1 wherein step a) comprises preparing a microemulsion containing particles of which the biggest particle has a size of less than approximately 0.15 microns in diameter.

3. The method for forming a region of low dielectric constant nanoporous material as recited in claim 1 wherein step a) comprises preparing a polymerization medium comprised of water, a surfactant, and said polymerization catalyst.

4. The method for forming a region of low dielectric constant nanoporous material as recited in step a) of claim 3 wherein said surfactant is selected from the group consisting of anionic, cationic, and nonionic surfactants.

5. The method for forming a region of low dielectric constant nanoporous material as recited in claim 1 wherein step b) comprises applying said microemulsion, using a spin-on-process, to said surface above which it is desired to form said region of low dielectric constant nanoporous material.

6. The method for forming a region of low dielectric constant nanoporous material as recited in claim 1 wherein said thermal process of step c) comprises subjecting said microemulsion, which has been applied to said surface, to a first thermal treatment stage and to a second thermal treatment stage.

7. The method for forming a region of low dielectric constant nanoporous material as recited in step c) of claim 6 wherein said first thermal treatment stage is performed to remove water and surfactant from said microemulsion such that pores are formed.

8. The method for forming a region of low dielectric constant nanoporous material as recited in step c) of claim 6 wherein said second thermal treatment stage is performed to harden said microemulsion and improve adhesion of said microemulsion to said surface above which it is desired to form said region of low dielectric constant nanoporous material.

9. The method for forming a region of low dielectric constant nanoporous material as recited in step c) of claim 6 wherein said first thermal treatment stage comprises subjecting said microemulsion to a temperature of approximately 200 degrees Celsius.

10. The method for forming a region of low dielectric constant nanoporous material as recited in step c) of claim 6 wherein said second thermal treatment stage comprises subjecting said microemulsion, which has been applied to said surface, to a temperature of approximately 350 degrees Celsius.

11. A method for forming a region of low dielectric constant nanoporous material, said method comprising the steps of:
   a) preparing a microemulsion that is stable, wherein said microemulsion includes polydiorganosiloxane material, and wherein said step a) includes using an emulsion polymerization technique to form said polydiorganosiloxane material by using a polymerization catalyst to catalyze polymerization of a polydiorganosiloxane precursor comprising a cyclic siloxane;
   b) applying said microemulsion to a surface above which it is desired to form said region of low dielectric constant nanoporous material; and
   c) subjecting said microemulsion, which has been applied to said surface, to a thermal process such that said region of low dielectric constant nanoporous material is formed above said surface, said thermal process comprising:

a first thermal treatment stage, said first thermal treatment stage performed to remove water and surfactant from said microemulsion such that pores are formed, and a second thermal treatment stage, said second thermal treatment stage performed to harden said microemulsion and improve adhesion of said microemulsion to said surface above which it is desired to form said region of low dielectric constant nanoporous material.

12. The method for forming a region of low dielectric constant nanoporous material as recited in claim 11 wherein step a) comprises preparing a microemulsion containing particles of which the biggest particle has a size of less than approximately 0.15 microns in diameter.

13. The method for forming a region of low dielectric constant nanoporous material as recited in claim 11 wherein step a) comprises preparing a polymerization medium comprised of water, a surfactant, and said polymerization catalyst.

14. The method for forming a region of low dielectric constant nanoporous material as recited in step a) of claim 13 wherein said surfactant is selected from the group consisting of anionic, cationic, and nonionic surfactants.

15. The method for forming a region of low dielectric constant nanoporous material as recited in claim 11 wherein step b) comprises applying said microemulsion, using a spin-on-process, to said surface above which it is desired to form said region of low dielectric constant nanoporous material.

16. The method for forming a region of low dielectric constant nanoporous material as recited in step c) of claim 11 wherein said first thermal treatment stage comprises subjecting said microemulsion to a temperature of approximately 200 degrees Celsius.

17. The method for forming a region of low dielectric constant nanoporous material as recited in step c) of claim 11 wherein said second thermal treatment stage comprises subjecting said microemulsion, which has been applied to said surface, to a temperature of approximately 350 degrees Celsius.

* * * * *